United States Patent
Wang

(10) Patent No.: US 6,190,974 B1
(45) Date of Patent: Feb. 20, 2001

(54) METHOD OF FABRICATING A MASK ROM

(75) Inventor: Ling-Sung Wang, Hsinchu (TW)

(73) Assignee: Worldwide Semiconductor Manufacturing Corp., Hsinchu (TW)

(*) Notice: Under 35 U.S.C. 154(b), the term of this patent shall be extended for 0 days.

(21) Appl. No.: 09/515,953

(22) Filed: Feb. 29, 2000

(30) Foreign Application Priority Data

May 10, 1999 (TW) .................................................. 88117114

(51) Int. Cl.[7] .............................................. H01L 21/8236
(52) U.S. Cl. ........................ 438/276; 438/275; 438/277; 438/278
(58) Field of Search ................................... 438/275, 276, 438/277, 278

(56) References Cited

U.S. PATENT DOCUMENTS

| | | | |
|---|---|---|---|
| 5,648,289 | * | 7/1997 | Park . |
| 5,747,856 | * | 5/1998 | Chen et al. ........................... 257/390 |
| 5,751,040 | * | 5/1998 | Chen et al. ........................... 257/332 |

* cited by examiner

*Primary Examiner*—Trung Dang
(74) *Attorney, Agent, or Firm*—Jiawei Huang; J C Patents

(57) ABSTRACT

A method of fabricating a mask read-only memory. Before carrying out a code implantation, a coding mask is used as an etching mask to remove a portion of the inter-metal dielectric layer and the inter-layer dielectric layer above the coding positions, thereby forming a contact window. The code implantation is subsequently carried out so these ions can easily reach the coding positions via the contact opening.

13 Claims, 5 Drawing Sheets

METHOD OF FABRICATING A MASK ROM

CROSS-REFERENCE TO RELATED APPLICATION

This application claims the priority benefit of Taiwan application serial no. 88117114, filed Oct. 5, 1999.

BACKGROUND OF THE INVENTION

1. Field of the Invention

The present invention relates to a method of fabricating a semiconductor device. More particularly, the present invention relates to a method of fabricating a mask read-only memory (mask ROM).

2. Description of the Related Art

Read-only memory (ROM) is a type of non-volatile memory that retains data even when the power is off. In fact, non-volatile memory is essential for starting up most computer-controlled electronic products before operating in a normal state.

Mask ROM is one of the most basic types of non-volatile memory. To facilitate fabrication, the transistor within each memory unit is usually formed first. Metallic lines for connecting to the transistor are subsequently laid by a forming a photomask layer. Alternatively, metallic lines for connecting to the transistor are already formed and an ion implantation is subsequently carried out using a patterned photomask to adjust the threshold voltage of some of the transistors. Such programming of a mask ROM through an ion implantation process is also known as code implantation.

According to the aforementioned method of fabricating a mask ROM, very few modifications are needed to accommodate some changes in product requirement. Changes can be made simply by fabricating a new set of photomasks. Hence, the method is particularly suitable for mass production. To shorten delivery time to customers, it is possible to fabricate the mask ROM to the stage prior to programming and then store them as semi-finished product. Later, when the desired program code arrives, a code implantation of the semi-finished mask ROM and some other finishing steps can be carried out.

At present, other types of memory or logic devices and a mask ROM are also integrated together to increase chip performance. For example, an embedded static random access memory (embedded SRAM) and a mask ROM are integrated together.

In general, most static random access memory (SRAM) requires two metallic layers. The metallic layers are formed in a metallization process. Conventionally, the code implantation for adjusting the threshold voltage of transistors is conducted before the formation of an inter-layer dielectric (ILD) layer. Since the photomask necessary for carrying out code implantation can be fabricated only after customer's order is received, the metallization process for SRAM is performed in the very last stage. Because a metallization process takes time, product shipment to customer must be delayed.

To shorten customer delivery time, attempts have been made to perform the necessary metallization process of the SRAM before the code implantation necessary for adjusting the threshold voltages of various mask ROM devices is carried out.

FIG. 1 is a graph showing the threshold voltage versus thickness of inter-layer dielectric (ILD) layer after chemical-mechanical polishing and code implantation.

In a metallization process, a planarization of the inter-layer dielectric (ILD) layer and the inter-metal dielectric (IMD) layer is necessary. In general, the ILD and the IMD layer are planarized by chemical-mechanical polishing (CMP). However, chemical-mechanical polishing produces a variation of thickness between the ILD and the IMD layer of more than 1000 Å. Variation of such magnitude can lead to imprecise adjustment of threshold voltage of devices in a code implantation of the mask ROM, thereby narrowing the coding window and increasing the level of difficulties in processing.

FIG. 2 is a graph with two curves showing the respective device saturation current ($I_{dSat}$) versus amount of overlapping in photolithographic operation for a code implantation conducted before and after the formation of the inter-layer dielectric (ILD) layer.

In FIG. 2, the curve linked by solid diamonds represents the relationship between device saturated current and the amount of overlapping in photolithographic operation for code implantation performed after the formation of the inter-layer dielectric (ILD) layer. On the other hand, the curve linked by solid squares represents the relationship between device saturated current and the amount of overlapping in photolithographic operation for code implantation performed before the formation of the ILD layer.

As shown in FIG. 2, it does not matter if the code implantation is carried out before or after the ILD layer is formed; saturated current decreases when the amount of overlapping increases. However, under the same overlapping conditions, performing a implantation after the formation of the ILD layer produces a smaller saturated current than performing a code implantation before the formation of the ILD layer.

This is because when the feature size of a mask ROM is smaller than 0.35 μm, the scattering effect in a code implantation is intensified. Since both the ILD layer and the IMD layer have a definite thickness, a portion of the ion beam used in the code implantation may be blocked. However, using a high-energy ion beam in code implantation can lead to heavy scattering, ultimately leading to a fall in device saturated current as well as an increase in device switching problems.

In the meantime, as feature size of devices within a mask ROM falls below 0.35 μm, the photolithographic operation needed to prepare for code implantation is harder to control. Overlapping occurs more often, leading to further lowering of device saturated current and more device reliability problems.

SUMMARY OF THE INVENTION

The present invention provides a method for fabricating a mask read-only memory. Through an etching process, code implantation of the mask ROM can be carried out without the need to use a high-energy ion beam to penetrate any inter-layer dielectric or inter-metal dielectric layer. Hence, problems in adjusting the device threshold voltage and the problems of having a lower device saturated current in a conventional mask ROM due to a high-energy coding beam can be resolved.

To achieve these and other advantages and in accordance with the purpose of the invention, as embodied and broadly described herein, the invention provides a method for forming a mask ROM. The method is suitable for fabricating an integrated circuit that comprises a mask ROM and other types of memory or logic circuit devices. A substrate is first provided. A buried bit line is formed in the substrate. A gate dielectric layer is formed over the substrate, and then a word line is formed on the surface of the gate dielectric layer. An inter-layer dielectric (ILD) layer is formed over the word line and the gate dielectric layer. A conductive plug is formed in the ILD layer such that the conductive plug is electrically connected to the buried bit line. A patterned metallic line layer is formed on the surface of the ILD layer. An inter-metal dielectric (IMD) layer is formed over the patterned metallic line layer and the ILD layer. A photolithographic operation is carried out to form a mask layer for subsequent coding operation. Using the mask layer as an etching mask, the IMD layer and the ILD layer are etched to form a contact opening. A code implantation is next carried out, implanting ions into the substrate via the contact opening. The coding mask is removed, and then a dielectric layer that fills the contact opening is formed.

In this invention, the mask for code implantation is also used as an etching mask to form a contact opening in the IMD and ILD layer that leads to the ion implant position on the substrate before code implantation.

Since the ion beam for coding does not need to penetrate the IMD layer or the ILD layer in order to reach the substrate, a high-energy beam is unnecessary. Hence, the scattering of ions during code implantation is minimized so that saturated current of devices can be maintained and switching problems will occur less frequently.

In addition, since the ion beam for coding does not need to penetrate the IMD layer or the ILD layer, the threshold voltages of coded mask ROM devices are not affected by thickness variation of the layers after chemical-mechanical polishing. Consequently, processing window of the coding operation is greater.

Furthermore, because the ion beam does not have to go through the IMD or the ILD layer, increased overlapping in photolithographic operation resulting from device miniaturization will have little effect on the saturated current of the devices. Hence, the device will have a better switching characteristic.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
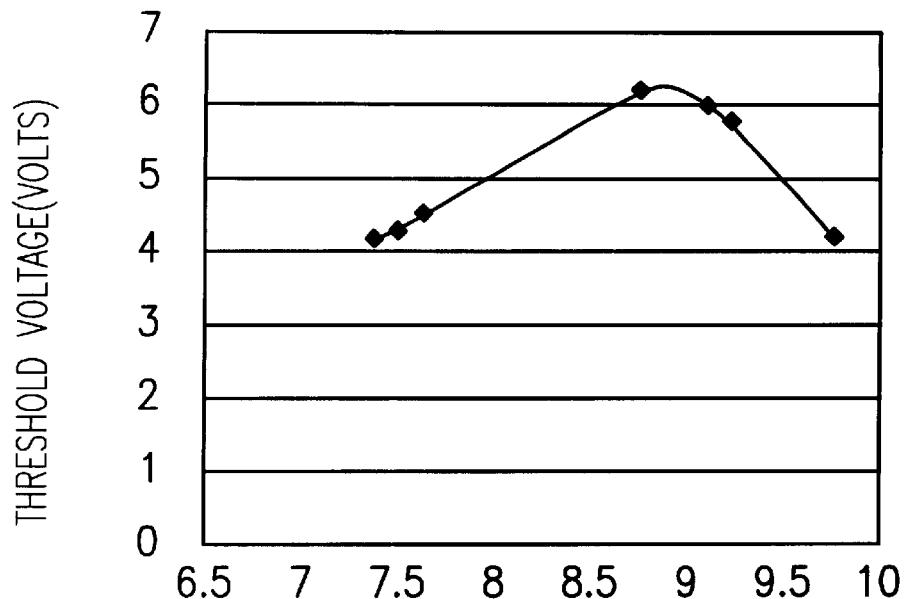
FIG. 1 is a graph showing the threshold voltage versus thickness of inter-layer dielectric (ILD) layer after chemical-mechanical polishing and code implantation.
Figure 2:
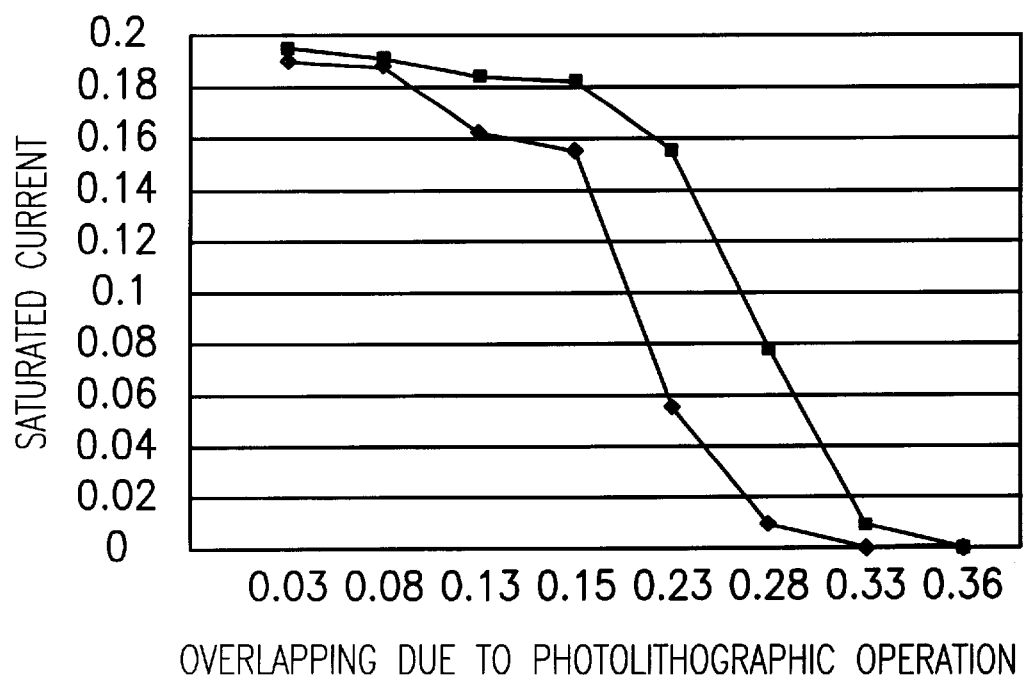
FIG. 2 is a graph with two curves showing the respective device saturation current ($I_{dSat}$) versus amount of overlapping in photolithographic operation for a code implantation conducted before and after the formation of the inter-layer dielectric (ILD) layer.

Reference will now be made in detail to the present preferred embodiments of the invention, examples of which are illustrated in the accompanying drawings. Wherever possible, the same reference numbers are used in the drawings and the description to refer to the same or like parts.

FIGS. 3A, 4A, 5A, 6A and 7A are schematic cross-sectional views along the word line direction of a mask ROM showing the progression of steps for producing the mask ROM according to one preferred embodiment of this invention.

FIGS. 3B, 4B, 5B, 6B and 7B are schematic cross-sectional views along the bit line direction of a mask ROM showing the progression of steps for producing the mask ROM according to the preferred embodiment of this invention.

Figure 3A:
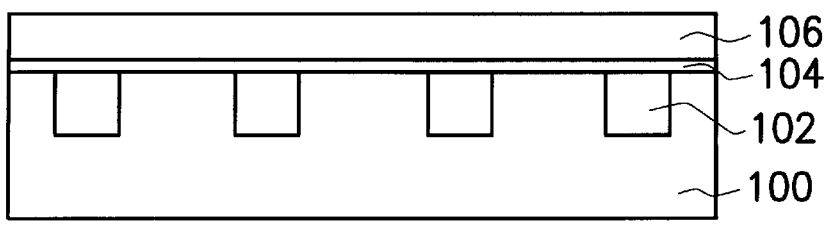
FIGS. 3A, 4A, 5A, 6A and 7A are schematic cross-sectional views along the word line direction of a mask ROM showing the progression of steps for producing the mask ROM according to one preferred embodiment of this invention.
Figure 3B:
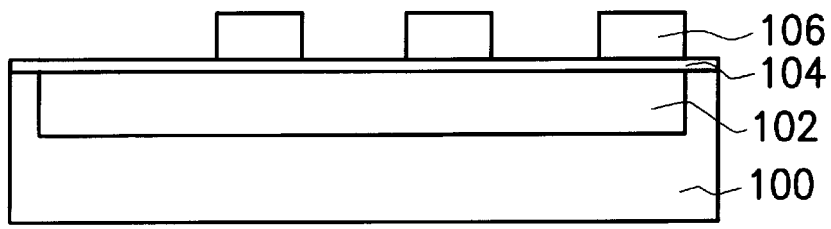
FIGS. 3B, 4B, 5B, 6B and 7B are schematic cross-sectional views along the bit line direction of a mask ROM showing the progression of steps for producing the mask ROM according to the preferred embodiment of this invention.

As shown in FIGS. 3A and 3B, buried bit lines 102 are first formed in a substrate 100. A gate dielectric layer 104 is formed over the substrate. Word lines 106 are next formed over the gate dielectric layer 104.

The buried bit lines 102 can be formed by, for example, forming a patterned mask using a photolithographic technique, and then implanting ions into the substrate 100 via the mask. The ions implanted into the substrate 100 can be N-type ions, for example.

The gate dielectric layer 104 can be formed by, for example, thermal oxidation. The word lines 106 are formed by, for example, forming a conductive layer (not shown) such as polysilicon over the gate dielectric layer 104 through the performance of a low-pressure chemical vapor deposition (LPCVD). The conductive layer is patterned using photolithographic and etching processes to form the word lines 106.

Figure 4A:
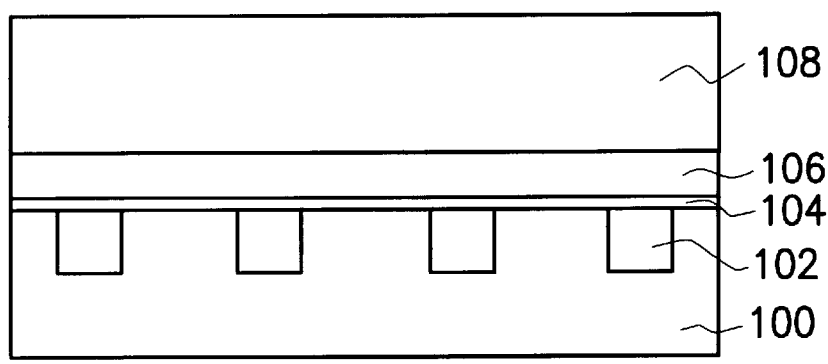
Figure 4B:
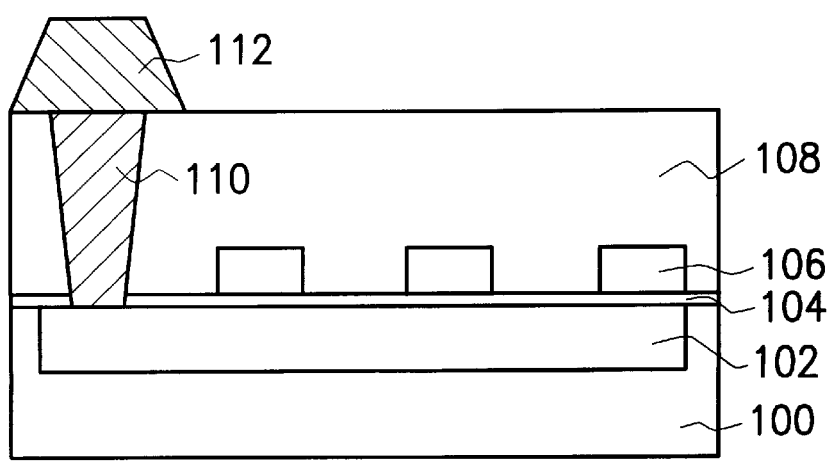

As shown in FIGS. 4A and 4B, an inter-layer dielectric (ILD) layer 108 is formed over the word lines 106 and the gate dielectric layer 104. The ILD layer 108 can be a silicon oxide layer formed by, for example, chemical vapor deposition.

Since the word lines 106 and the exposed gate dielectric layer 104 are not formed to the same height, the top surface of the ILD layer 108 has a highly undulating surface profile. To reduce subsequent processing problems, the ILD layer is usually planarized to remove any topological variation. At present, the most common method for planarizing an ILD layer is chemical-mechanical polishing (CMP).

A conductive plug 110 is formed in the dielectric layer 108. The conductive plug 110 is electrically connected to the buried bit line 102 within the substrate 100. The conductive plug 110 can be tungsten formed by chemical vapor depositing. To form the conductive plug 110, photolithographic and etching techniques are used to form a contact opening in the ILD layer 108 leading to the buried bit line 102. Conductive material such as tungsten formed by chemical vapor depositing (not shown in the figure) is deposited into the contact opening and over the ILD layer 108. Finally, excess conductive material above the ILD layer 108 is removed. The excess conductive material can be removed by, for example, etching or chemical-mechanical polishing.

A metallic interconnect pattern 112 that connects electrically to the conductive plug 110 is formed over the ILD layer 108. The method of forming the interconnect pattern 112 includes depositing metallic material over the ILD layer 108 to form a metallic layer (not shown), and then patterning the metallic layer by conducting photolithographic and etching processes.

Figure 5A:
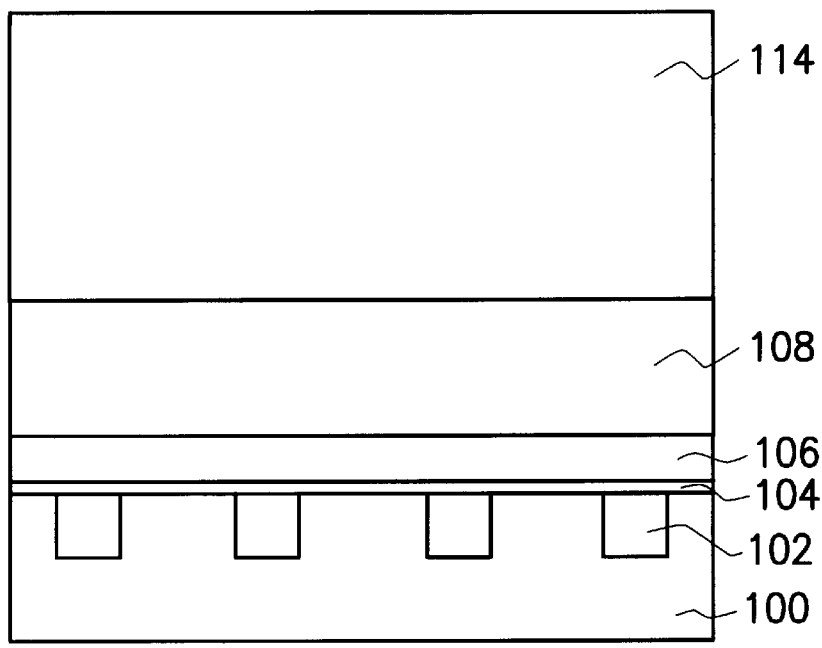
Figure 5B:
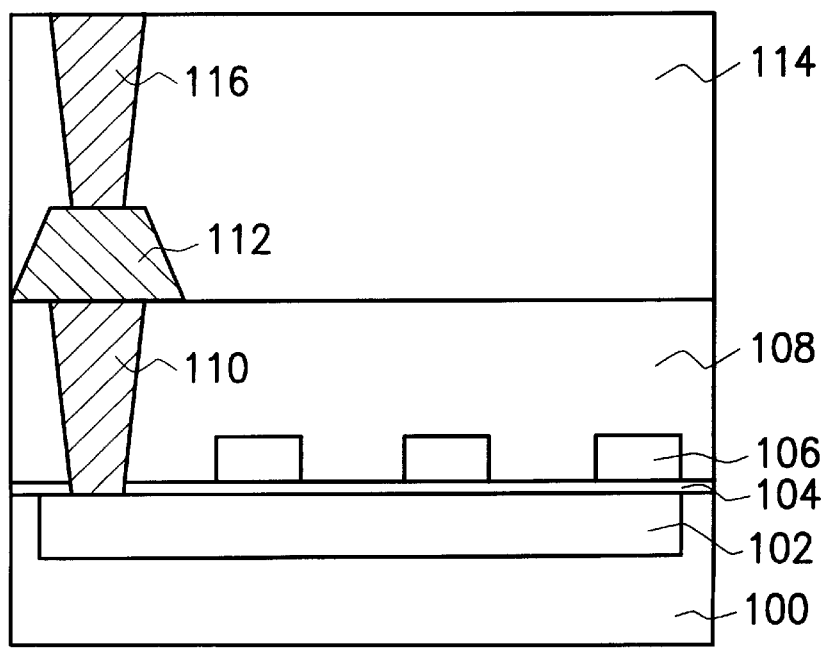

As shown in FIGS. 5A and 5B, an inter-metal dielectric (IMD) layer 114 is formed over the metallic interconnect pattern 112 and over the ILD layer 108. The IMD layer can be a silicon oxide layer formed by, for example, chemical vapor deposition. After formation, the IMD layer 114 is usually planarized after formation by performing chemical-mechanical polishing, for example.

A conductive plug 116 that connects electrically to the metallic interconnect pattern 112 is formed in the IMD layer 114. The conductive plug 116 can be, for example, tungsten formed by chemical vapor depositing. The conductive plug 114 can be formed by, for example, patterning out a contact opening using photolithographic and etching techniques. Conductive material, such as tungsten, is deposited into the opening and over the IMD layer 114 to form a conductive layer (not shown). Excess conductive material above the IMD layer is removed. The excess conductive material can be removed by, for example, etching or chemical-mechanical polishing.

Figure 6A:
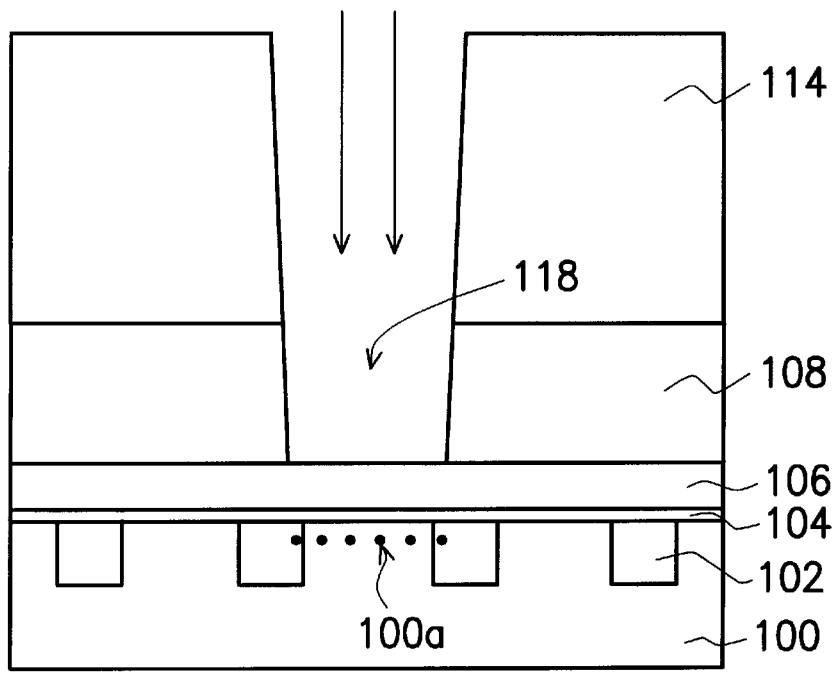
Figure 6B:
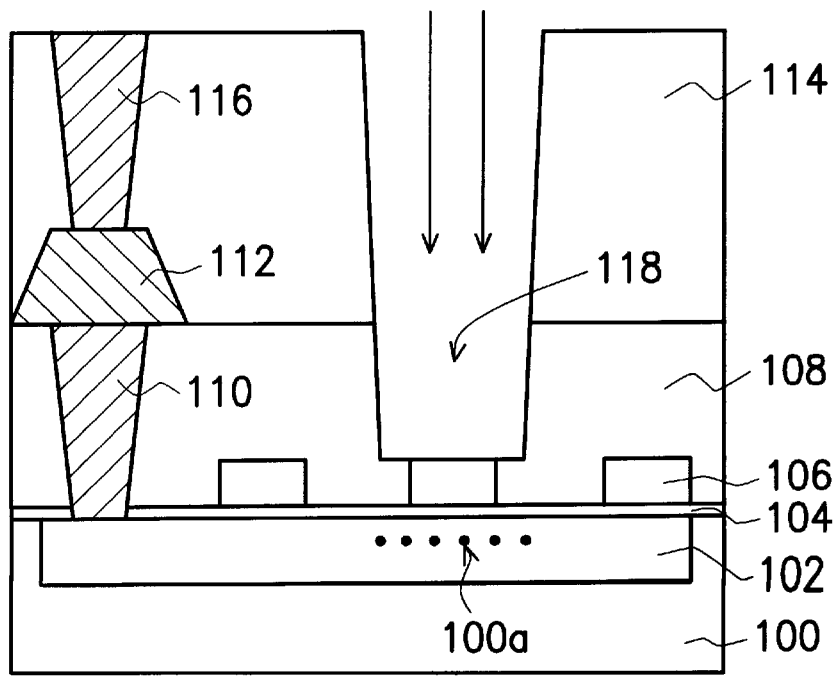

As shown in FIGS. 6A and 6B, a code implantation is carried out to implant ions into a coding position 100a on the substrate 100. First, a photolithographic operation is conducted to form a coding mask. Using the coding mask as an etching mask, the IMD layer 114 and the ILD layer 108 are sequentially etched to form a contact opening 118 that leads to the coding position 100a and exposes a word line 106. An ion implantation is next carried out so that ions passing into the contact opening 118 are able to penetrate through the word line 106 and are trapped within the coding position 100a in the substrate 100. Finally, the coding mask is removed.

Since the ions for the code implantation do not have to penetrate through the IMD layer 114 and the ILD layer 108 to reach the coding position 100a, a high-energy ion beam is unnecessary. Consequently, heavy scattering of the ions can be avoided and switching problems of devices due to a lowering of the saturated current can be prevented.

Figure 7A:
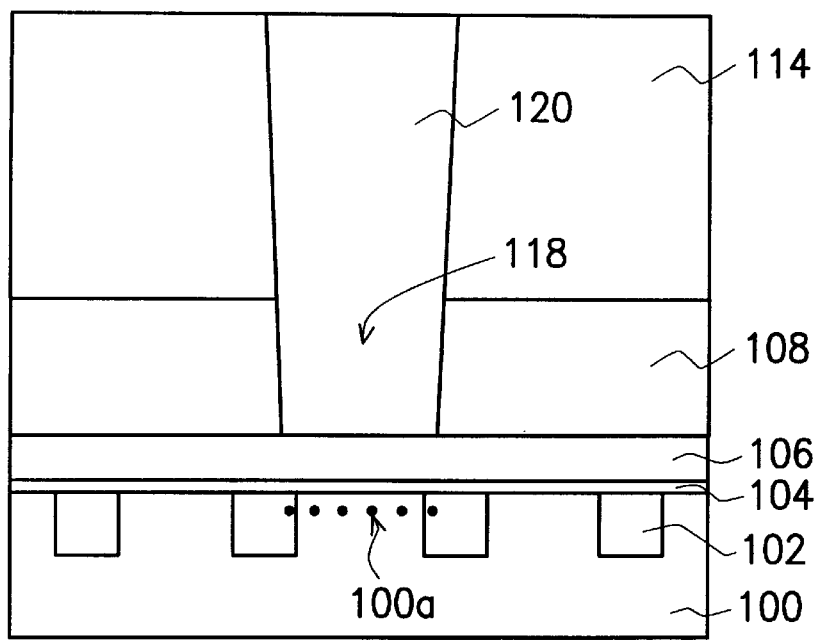
Figure 7B:
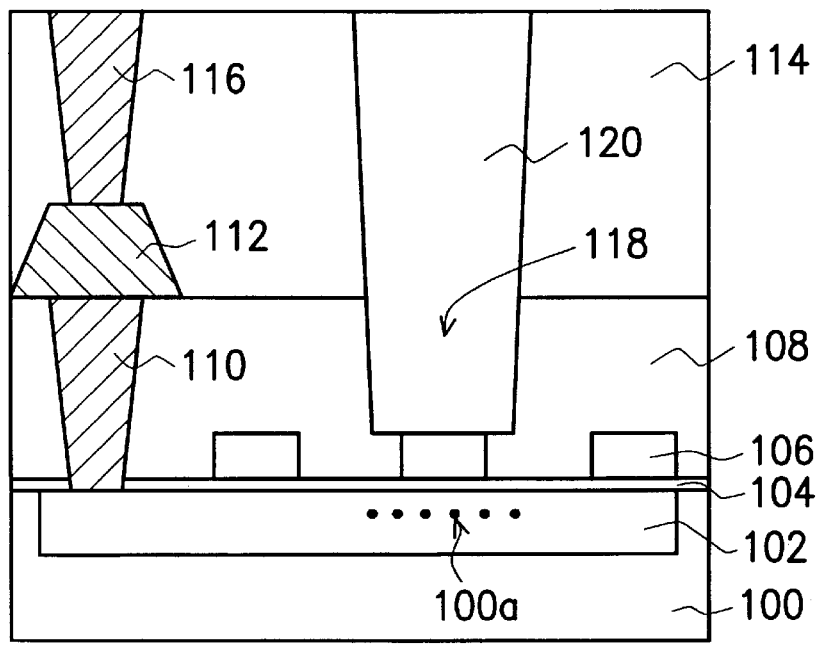

As shown in FIGS. 7A and 7B, a dielectric layer 120 is formed inside the contact opening 118. The dielectric layer 120 can be formed by, for example, depositing dielectric material into the opening 118 and over the IMD layer 114 to form a dielectric layer (not shown, can use the same material as the IMD layer 114) in a high density plasma chemical vapor deposition (HDPCVD) or in a spin-on-glass (SOG) process. Excess dielectric material above the IMD layer 114 is next removed in a planarization process. The excess dielectric material can be removed by, for example, chemical-mechanical polishing.

Subsequent operations such as metallization for the complete formation of a device are carried out. Since conventional techniques are used, detailed description of these operations is omitted here.

In the embodiment of this invention, the code implantation is carried out after the IMD layer is formed. If no metallization process is required, as in the case of the mask ROM, the code implantation can be carried out after the ILD layer is formed.

In this invention, the mask for code implantation is also used as an etching mask to form a contact opening in the IMD and ILD layer that leads to the ion implant position on the substrate before code implantation.

Since the ion beam for coding does not need to penetrate the IMD layer or the ILD layer in order to reach the substrate, a high-energy beam is unnecessary. Hence, scattering of ions during code implantation is minimized so that saturated current of devices can be maintained and switching problems will occur less frequently.

In addition, since the ion beam for coding does not need to penetrate the IMD layer or the ILD layer, the threshold voltages of coded mask ROM devices are not affected by thickness variations of the layers after chemical-mechanical polishing. Consequently, processing window of the coding operation is greater.

Furthermore, because the ion beam does not have to go through the IMD or the ILD layer, increased overlapping in photolithographic operation resulting from device miniaturization will have little effect on the saturated current of the devices. Hence, the device will have a better switching characteristic.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a mask read-only memory (mask ROM) for forming a circuit having a mask ROM and other types of memory or logic devices therein, comprising the steps of:

providing a substrate having a plurality of bit lines, a plurality of word lines, an inter-layer dielectric layer, an inter-metal dielectric layer and a metallic interconnect pattern;

performing a photolithographic operation to form a coding mask for code implantation over the inter-metal dielectric layer;

etching the inter-metal dielectric layer and the inter-layer dielectric layer to form a contact opening leading to a device using the coding mask as an etching mask;

performing an ion implantation to implant ions into coding positions of the substrate of the device;

removing the coding mask; and depositing dielectric material to form a dielectric layer inside the contact opening.

2. The method of claim 1, wherein other types of memory or logic devices include dynamic random access memory (DRAM).

3. The method of claim 1, wherein the inter-metal dielectric layer, the inter-layer dielectric layer and the dielectric layer are respectively planarized after they are formed.

4. The method of claim 3, wherein the step of planarizing various dielectric layers includes chemical-mechanical polishing.

5. The method of claim 1, wherein a material for forming the inter-metal dielectric layer, the inter-layer dielectric layer and the dielectric layer includes silicon oxide.

6. A method of fabricating mask read-only memory (mask ROM) for forming a circuit having a mask ROM and other types of memory or logic devices therein, comprising the steps of:

providing a substrate;

forming a buried bit line in the substrate;

forming a gate dielectric layer over the substrate;

forming a word line over the gate dielectric layer;

forming an inter-layer dielectric layer over the word line and the gate dielectric layer;

forming a conductive plug in the inter-layer dielectric layer such that the conductive plug is electrically connected to the buried bit line in the substrate;

forming a metallic interconnect pattern over the inter-layer dielectric layer;

forming an inter-metal dielectric layer over the metallic interconnect pattern and the inter-layer dielectric layer;

performing a photolithographic operation to form a coding mask for code implantation over the inter-layer dielectric layer;

etching the inter-metal dielectric layer and the inter-layer dielectric layer to form a contact opening using the coding mask as an etching mask;

performing an ion implantation to implant ions into coding positions of the substrate of the device;

removing the coding mask; and depositing dielectric material to form a dielectric layer inside the contact opening.

7. The method of claim 6, wherein other types of memory or logic devices include dynamic random access memory (DRAM).

8. The method of claim 6, wherein the inter-metal dielectric layer, the inter-layer dielectric layer and the dielectric layer are respectively planarized after they are formed.

9. The method of claim 8, wherein the step of planarizing various dielectric layers includes chemical-mechanical polishing.

10. The method of claim 6, wherein a material for forming the inter-metal dielectric layer, the inter-layer dielectric layer and the dielectric layer includes silicon oxide.

11. A method of fabricating a mask read-only memory (mask ROM) for forming a circuit having a mask ROM and dynamic random access memory (DRAM) therein, comprising the steps of:

providing a substrate;

forming a buried bit line in the substrate;

forming a gate dielectric layer over the substrate;

forming a word line over the gate dielectric layer;

forming an inter-layer dielectric layer over the word line and the gate dielectric layer;

planarizing the inter-layer dielectric layer;

forming a conductive plug in the inter-layer dielectric layer such that the conductive plug is electrically connected to buried bit line in the substrate;

forming a metallic interconnect pattern over the inter-layer dielectric layer;

forming an inter-metal dielectric layer over the metallic interconnect pattern and the inter-layer dielectric layer;

planarizing the inter-metal dielectric layer;

performing a photolithographic operation to form a coding mask for code implantation over the inter-metal dielectric layer;

etching the inter-metal dielectric layer and the inter-layer dielectric layer to form a contact opening using the coding mask as an etching mask;

performing an ion implantation to implant ions into coding positions of the substrate of the device;

removing the coding mask;

depositing dielectric material to form a dielectric layer inside the contact opening; and planarizing the dielectric layer.

12. The method of claim 11, wherein the step of planarizing the inter-layer dielectric layer, the inter-metal dielectric layer and the dielectric layer includes chemical-mechanical polishing.

13. The method of claim 11, wherein a material for forming the inter-metal dielectric layer, the inter-layer dielectric layer and the dielectric layer includes silicon oxide.

* * * * *